(12) United States Patent
Katsuyama

(10) Patent No.: US 7,723,138 B2
(45) Date of Patent: May 25, 2010

(54) METHOD OF FABRICATING A SEMICONDUCTOR OPTICAL DEVICE

(75) Inventor: Tomokazu Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 240 days.

(21) Appl. No.: 11/902,781

(22) Filed: Sep. 25, 2007

(65) Prior Publication Data

US 2009/0117676 A1    May 7, 2009

(30) Foreign Application Priority Data

Sep. 28, 2006  (JP) ............................. P2006-265327

(51) Int. Cl.
*H01L 21/00* (2006.01)
(52) U.S. Cl. .......................................... 438/32; 438/16
(58) Field of Classification Search .......... 257/E31.127; 438/24, 385, 16, 31, 32
See application file for complete search history.

(56) References Cited

U.S. PATENT DOCUMENTS 4,820,655 A * 4/1989 Noda et al. .................... 438/24
5,472,907 A * 12/1995 Binsma et al. ................. 438/31

2008/0003704 A1 * 1/2008 Katsuyama ................... 438/16

OTHER PUBLICATIONS

"in-Situ Etched Buried Heterostructure for Uncooled and Extended Reach Modulated Lasers", K. Hinzer et al., Technical Digest of Optical Fiber Communication, vol. 2, OFC2003, pp. 684-685.

* cited by examiner

*Primary Examiner*—Thao X Le
*Assistant Examiner*—Tanika Warrior
(74) *Attorney, Agent, or Firm*—Smith, Gambrell & Russell, LLP

(57) ABSTRACT

A method of fabricating a semiconductor optical device is disclosed. This semiconductor optical device includes first and second optical semiconductor elements. This method comprises the steps of: growing, in a metal-organic vapor phase deposition reactor, plural semiconductor layers for the first semiconductor optical element on a primary surface of a substrate which has first and second areas for the first semiconductor optical element and the second optical semiconductor element, respectively; forming an insulating mask on the plural semiconductor layers and the first area; etching the plural semiconductor layers by use of the insulating mask to form a semiconductor portion having an end face; growing a layer of a first semiconductor on the second area and deposit of the first semiconductor on the end face in the reactor by use of the insulating mask; supplying etchant for etching the first semiconductor to remove at least a part of the deposit of the first semiconductor on the end face by use of the insulating mask; and after removing the deposit of the first semiconductor, growing a layer of a second semiconductor for the second optical element on the second area in the reactor by use of the insulating mask.

19 Claims, 7 Drawing Sheets

(a)

(b)

METHOD OF FABRICATING A SEMICONDUCTOR OPTICAL DEVICE

BACKGROUND OF THE INVENTION

1. Field of the Invention

This invention relates to the method of fabricating a semiconductor optical device.

2. Related Background Art

Non-Patent Publication (K. Hinzer et al., Technical Digest of Optical Fiber Communication, 2003, FG7, p. 684-685) discloses a buried semiconductor laser. In the fabrication of this semiconductor laser, after forming a mesa-stripe $SiO_2$ mask on a semiconductor stack of a substrate, this substrate is loaded into a metal-organic vapor phase deposition (MOVPE) reactor. In order to perform mesa-etching, methyl-iodide as an etchant is supplied to this reactor and $PH_3$ gas is also supplied to the reactor. After this etching, the mesa stripe is buried by selective regrowth in the same reactor to form a pn block layer.

SUMMARY OF THE INVENTION

A semiconductor laser and an electro-absorption modulator are integrated to provide a semiconductor optical device. The semiconductor optical device has a butt joint structure to optically couple the semiconductor laser and the electro-absorption modulator with each other. This butt joint structure is formed as follows: A semiconductor stack structure including a number of semiconductor layers, such as an n-type cladding layer, an active layer and a p-type cladding layer, is formed on both an area for the modulator and an area for the semiconductor laser of a substrate. Then, an insulating mask is formed on the area for the semiconductor laser. The semiconductor stack structure is etched by use of the mask to remove semiconductor layers for an active layer located on the area for the modulator, and an end face of the semiconductor stack structure is formed. After this etching, plural semiconductor layers for the modulator are grown by use of the mask. In this growth, semiconductor is deposited on the above end face in addition to on the area the modulator. Due to an anomalous deposition, semiconductor deposit is grown upward along the end face of the semiconductor stack structure. The reason why this anomalous growth is caused is as follows. Raw material gas is supplied onto the substrate, and a portion of the raw material gas is supplied onto the insulating mask and is not deposited thereon. This unconsumed portion of the raw material gas flows along the insulating mask to the area for the modulator, and this material gas from the insulating mask is additionally deposited on the area for the modulator to cause anomalous semiconductor deposition. Accordingly, the raw material gas is supplied around the boundary between the areas for the modulator and the semiconductor laser to form the anomalous deposit on the end face as well as the desired semiconductor layer on the area for the modulator.

Thereafter, when subsequent semiconductor layers are formed thereon, the active layer for one of the modulator or laser is bent around the boundary of the above areas for the modulator and the laser because of the anomalous deposit. Accordingly, the height matching of the active layers for the semiconductor laser and modulator is not obtained at the boundary.

In contrast, Non-Patent publication discloses that methyl-iodide is supplied to the metal-organic-vapor-phase deposition reactor for mesa-etching, but does not disclose any integration of plural semiconductor devices.

It is an object to provide a method of fabricating a semiconductor optical device including first and second semiconductor optical elements that are integrated with each other, and this method permits the reduction of curve radius of semiconductor layers around the boundary of the first and second semiconductor optical elements of the semiconductor optical device.

One aspect of the present invention is a method of fabricating a semiconductor optical device, and this semiconductor optical device includes a first semiconductor optical element and a second optical semiconductor element. The method comprises the steps of: growing, in a metal-organic vapor phase deposition reactor, plural semiconductor layers for the first semiconductor optical element on a primary surface of a substrate, which has a first area for the first semiconductor optical element and a second area for the second optical semiconductor element; forming an insulating mask on the plural semiconductor layers and the first area; etching the plural semiconductor layers by use of the insulating mask to form a semiconductor portion having an end face; after etching the plural semiconductor layers, growing a layer of a first semiconductor for the second optical element on the second area and deposit of the first semiconductor on the end face in the metal-organic vapor phase deposition reactor by use of the insulating mask; after growing the layer of the first semiconductor, supplying etchant for etching the first semiconductor to remove at least a part of the deposit of the first semiconductor on the end face by use of the insulating mask; and after removing at least a part of the deposit of the first semiconductor, growing a layer of a second semiconductor for the second optical element on the second area in the metal-organic vapor phase deposition reactor by use of the insulating mask.

In the method according to the present invention, gas containing the etchant for etching the first semiconductor is supplied to the metal-organic vapor phase deposition reactor. Further, in the method according to the present invention, the gas containing the etchant for etching the first semiconductor includes HCl, and further includes at least one of $AsH_3$ and $PH_3$.

In the method according to the present invention, the layer of the first semiconductor is formed for an optical guide layer of the second optical semiconductor element, and the layer of the second semiconductor is formed for an active layer of the second optical semiconductor element. Further, in the method according to the present invention, the semiconductor portion includes a semiconductor layer for an active layer of the first semiconductor optical element.

In the method according to the present invention, one of the first and second optical semiconductor elements includes a semiconductor laser and the other of the first and second optical semiconductor elements includes an electro-absorption modulator.

The method according to the present invention further comprises the steps of: after growing the layer of the second semiconductor, growing a layer of a third semiconductor on the second area and deposit of the third semiconductor on the end face in the metal-organic vapor phase deposition reactor by use of the insulating mask; and after growing the layer of the third semiconductor, supplying etchant for etching the third semiconductor to remove at least a part of the deposit of the third semiconductor by use of the insulating mask. Further, in the method according to the present invention, the layer of the first semiconductor is formed for an optical guide layer of the second optical element; the layer of the second semiconductor is formed for an active layer of the second optical element; and the layer of the third semiconductor is formed for another optical guide layer of the second optical element. Furthermore, in the method according to the present invention, gas containing the etchant for etching the third semiconductor is supplied to the metal-organic vapor phase deposition reactor, and may include HCl.

The method according to the present invention further comprises the steps of: prior to growing the layer the first semiconductor, growing a layer of a fourth semiconductor for the second optical element on the second area and deposit of the fourth semiconductor on the end face in the metal-organic vapor phase deposition reactor by use of the insulating mask; and prior to growing the layer of the first semiconductor and after growing the layer of the fourth semiconductor, supplying etchant for etching the fourth semiconductor to remove at least a part of the deposit of the fourth semiconductor by use of the insulating mask. Further, in the method according to the present invention, the layer of the first semiconductor is formed for an optical guide layer of the second optical element; the layer of the second semiconductor is formed for an active layer of the second optical element; the layer of the third semiconductor is formed for another optical guide layer of the second optical element; and the layer of the fourth semiconductor is formed for a buffer layer of the second optical element. Furthermore, in the method according to the present invention, gas containing the etchant for etching the fourth semiconductor is supplied to the metal-organic vapor phase deposition reactor, and may include HCl.

The method according to the present invention further comprises the steps of: prior to growing the layer the first semiconductor, growing a layer of a third semiconductor for the second optical element on the second area and deposit of the third semiconductor on the end face in the metal-organic vapor phase deposition reactor by use of the insulating mask; and prior to growing the layer of the first semiconductor and after growing the layer of the third semiconductor, supplying etchant for etching the third semiconductor to remove at least a part of the deposit of the fourth semiconductor by use of the insulating mask. Further, in the method according to the present invention, the layer of the first semiconductor is formed for an optical guide layer of the second optical element; the layer of the second semiconductor is formed for an active layer of the second optical element; and the layer of the third semiconductor is formed for a buffer layer of the second optical element.

In the method according to the present invention, the end face extends along a reference plane which intersects with the primary surface. Further, in the method according to the present invention, the layer of the second semiconductor has a multiple quantum well structure for an active layer of the second optical semiconductor element. Furthermore, the insulating mask is made of silicon oxide.

BRIEF DESCRIPTION OF THE DRAWINGS

The above objects and other objects, features, and advantages of the present invention will be understood easily from the following detailed description of the preferred embodiments of the present invention with reference to the accompanying drawings.

DETAILED DESCRIPTION OF THE PREFERRED EMBODIMENTS

Referring to the accompanying drawings, embodiments of the present invention will be explained. When possible, parts identical to each other will be referred to with symbols identical to each other.

FIGS. 1 to 5 are cross sectional views for explaining a method of fabricating a semiconductor optical integrated device according to the embodiment of the present invention. In the subsequent explanation, a semiconductor laser (LD), as a first semiconductor optical element, and an electro-absorption (EA) modulator, as a second semiconductor optical element, both are formed on a substrate.

Figure 1:
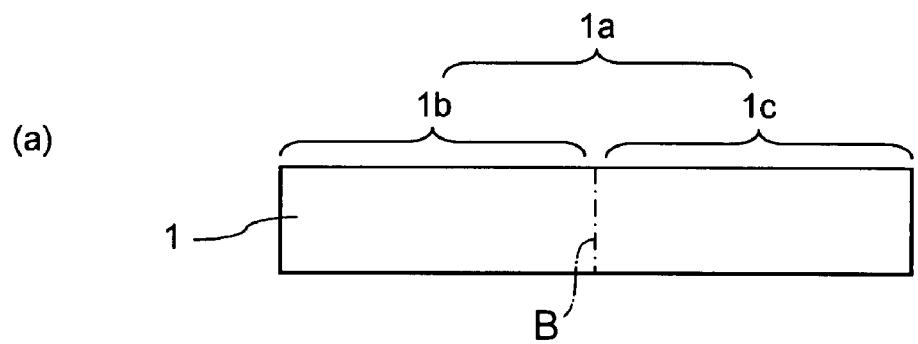
FIGS. 1 to 5 are cross sectional views showing a method of fabricating a semiconductor optical integrated device according to the embodiment of the present invention.
Figure 1:
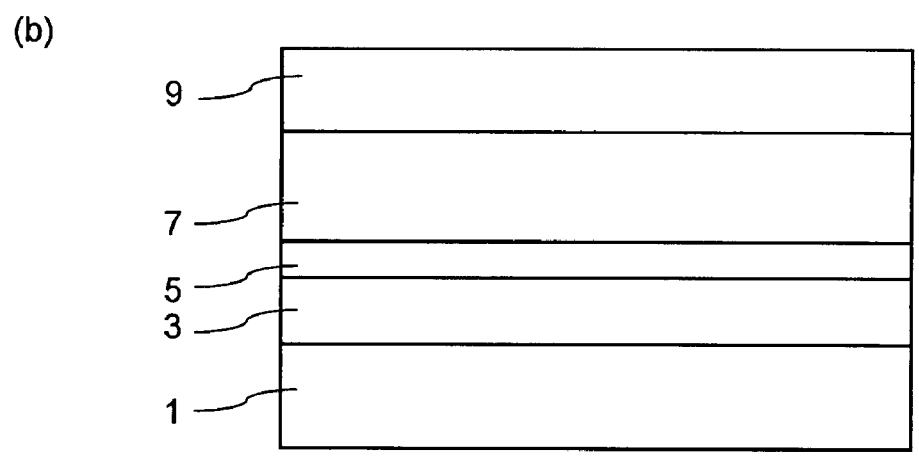
Figure 1:
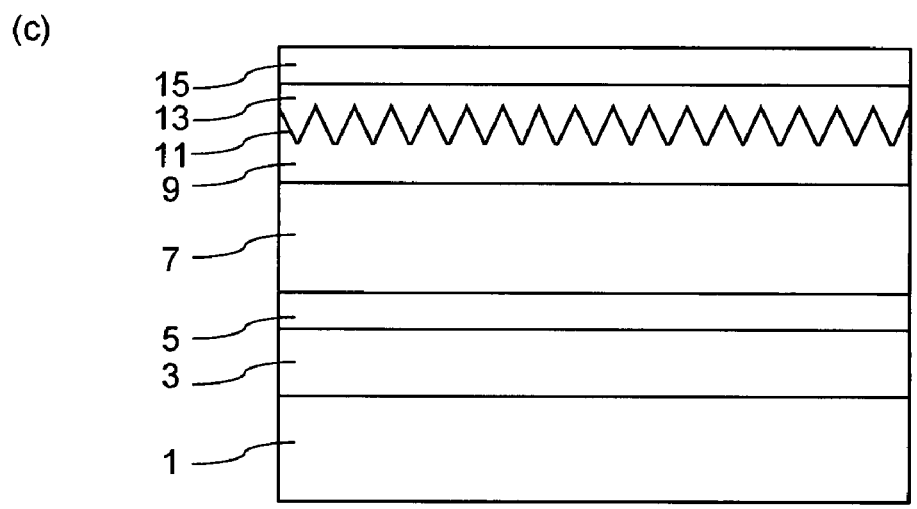

Referring to Part (a) of FIG. 1, an InP semiconductor substrate 1 is shown. The primary surface 1$a$ of the semiconductor substrate 1 has a first area 1$b$ (hereinafter referred to as "LD area") for the semiconductor laser and a second area 1$c$ (hereinafter referred to as "EA area") for the EA modulator. In Part (A) of FIG. 1 and other parts of other figures, the boundary of the LD area and the EA area is indicated by dashed line "B."

Referring to Part (b) of FIG. 1, a buffer layer 3, a first optical guide layer 5, an active layer 7, and a second optical guide layer 9 are subsequently grown in the whole of the primary surface 1$a$ of the semiconductor substrate 1. The buffer layer 3 is, for example, Si-doped InP layer and its thickness is 550 nanometers. In the present example, the carrier density of the buffer layer 3 is, for example, $1.1 \times 10^{+18}$ cm$^{-3}$. The first and second optical guide layers 5 and 9 are, for example, a GaInAsP layer corresponding to the wavelength of 1550 nanometers, and its thickness is 100 nanometers.

The active layer 7 is made of GaInAsP, for example. The active layer 7 has a multiple quantum well structure including barrier layers and well layers, for example, sixteen layers (eight pairs of barrier layers and well layers) which are alternately arranged. In the present example, each barrier layer has a bandgap wavelength of 1200 nanometers and a thickness of 10 nanometers, and each well layer has a bandgap wavelength of 1150 nanometers and a thickness of 5 nanometers. For example, 1.0%-strained active layer can be used.

Referring to Part (c) of FIG. 1, a diffraction grating 11 is formed on the second optical guide layer 9. The period of the diffraction grating 11 is, for example, 242 nanometers. A cladding layer 13 is formed on the diffraction grating 11. The cladding layer 13 is made of InP layer doped with zinc, and has a thickness of 240 nanometers. The carrier density of the cladding layer 13 is $6.5 \times 10^{+17}$ cm$^{-3}$. A cap layer 15 is formed on the cladding layer 13. The cap layer 15 is, for example, InGaAs layer doped with zinc, and has a thickness of 100 nanometers. The carrier density of the cap layer 15 is $2.0 \times 10^{+17}$ cm$^{-3}$.

The layers as explained above are grown on the whole of the primary surface 1$a$ of the InP semiconductor substrate by metal-organic-vapor-phase deposition method.

Figure 2:
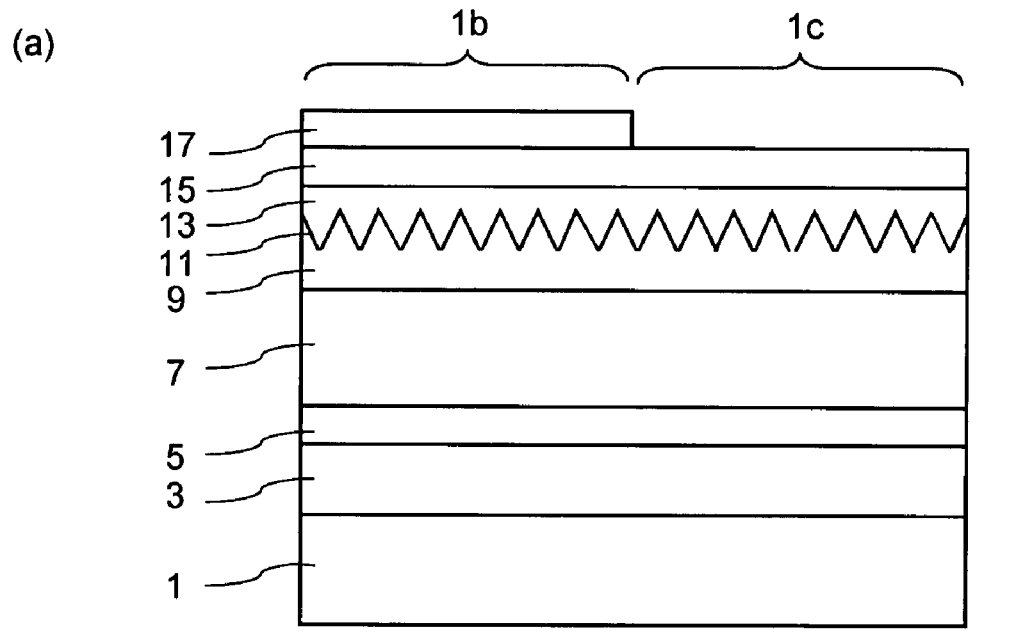
Figure 2:
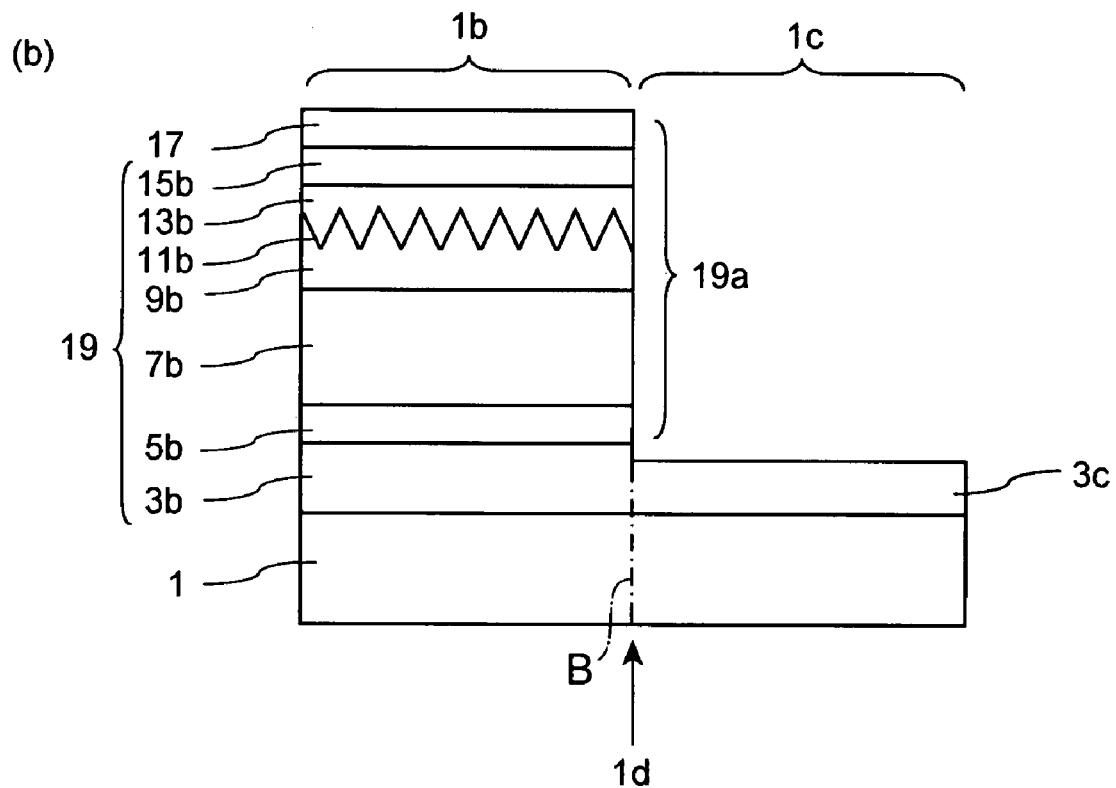

Referring to Part (a) of FIG. 2, a mask 17 made of an insulating film is formed on the cap layer 15. The insulating film mask 17 is located on the LD area 1$b$. The insulating film mask 17 is made of silicon oxide, such as SiO$_2$, or silicon nitride, such as SiN, and has a thickness of 200 nanometers, for example.

Referring to Part (b) of FIG. 2, the above plural semiconductor stack is etched using the insulating film mask 17 to form a semiconductor stack. In this etching, the first optical guide layer 5, the active layer 7, the second optical guide layer 9, the diffraction grating 11, the cladding layer 13 and the cap layer 15 are removed from the EA area 1c.

An etching, such as reactive ion etching (RIE), is used for this removal. Mixed gas of $CH_4$ and $H_2$ is supplied to the RIE apparatus. The flow rate of the mixed gas of $CH_4$ and $H_2$ is, for example, 25 sccm, and the RF power is, for example, 100 watts. The depth of the etching is, for example, 0.8 micrometers.

The reactive ion etching is carried out as above to form a first semiconductor portion 19 on the LD area 1b. This first semiconductor portion 19 includes a buffer layer 3b, a first optical guide layer 5b, an active layer 7b, a second optical guide layer 9b, the diffraction grating 11b, the cladding layer 13b and the cap layer 15b. The first semiconductor portion 19 has an end face 19a, which is formed by the above etching and is located at the boundary 1d of the LD area 1b and BA area 1c. The end face 19a extends along a reference plane intersecting with the primary surface 1a of the InP semiconductor substrate 1.

In an example shown in Part (b) of FIG. 2, a part of the buffer layer 3 is removed by RIE in the buffer layer 3c on the EA area 1c. After this etching, the surface of the buffer layer 3c is damaged to form, what is called, a damage layer, and it is preferable that this damage layer be removed. Sulfuric acid can be used as etchant for this removal.

Figure 3:
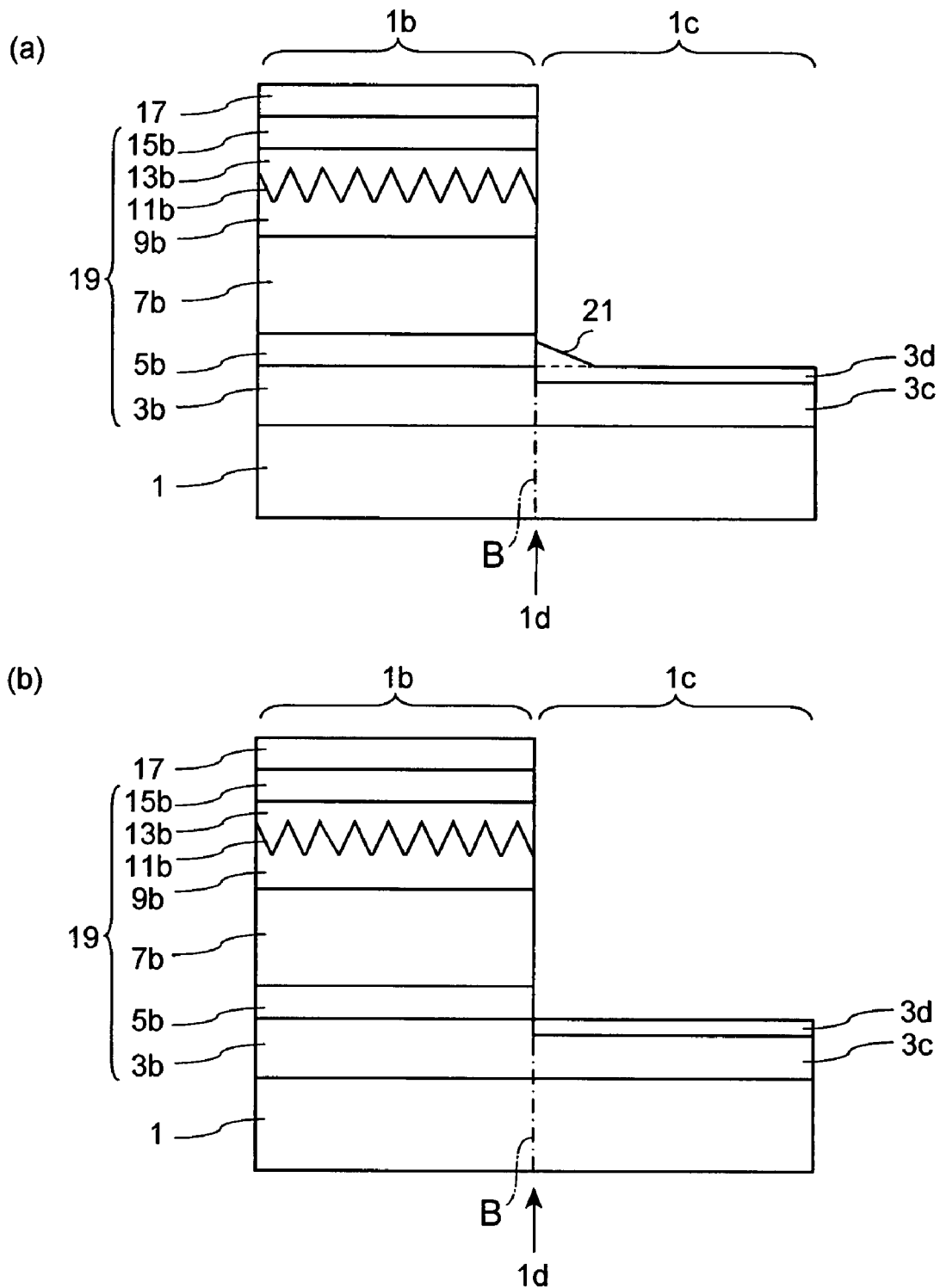

As shown in Part (a) of FIG. 3, a buffer layer 3d is formed on the buffer layer 3c. The buffer layer 3d is made of the same material as the buffer layer 3c and has a thickness of 50 nanometers. For example, the buffer layer 3d is Si-doped InP layer, and the carrier density of the buffer layer 3d is $1.1 \times 10^{+18}$ $cm^{-3}$.

This buffer layer 3d is grown using the insulating mask 17 by supplying raw material gas to the metal-organic vapor phase deposition reactor. Since the insulating film mask 17 is still left on the LD area 1b, a part of the raw material gas supplied onto the LD area 1b is not consumed for depositing semiconductor on the insulating film mask and this unconsumed raw material gas flows along the insulating film mask 17 to the EA area 1c. The raw material gas from the LD area 1b is consumed around the boundary 1d in the EA area 1c to form semiconductor deposit. Accordingly, as shown in Part (a) of FIG. 3, anomalous deposit 21 as well as the buffer layer 3d is formed on the end face 19a around the boundary 1d in the EA area 1c.

Referring to Part (b) of FIG. 3, the anomalous deposit 21 is removed by etching. In this etching step, mixed gas containing HCl, $PH_3$ and $AsH_3$ is used as etchant and is supplied to the metal-organic vapor phase deposition reactor for the etching. The flow rate of HCl is, for example, 0.1 sccm. The flow rate of $PH_3$ is, for example, 50 sccm. The flow rate of $AsH_3$ is, for example, 1.0 sccm. If required, the etching may be performed in an RIE apparatus, and the above etching gas can be used therein.

This etching is performed in the metal-organic vapor phase deposition reactor by use of the insulating film mask 17. The etching gas is supplied to the LD area 1b as well as the EA area 1c in the metal-organic vapor phase deposition reactor. The etching gas is not consumed on the insulating film mask 17 located on the LD area 1b, and the unconsumed etching gas flows along the insulating film mask 17 to the EA area 1c. The etching gas delivered to the EA area 1c is consumed to etch the anomalous deposit 21 in the EA area 1c around the boundary 1d. As in the case of the formation of the anomalous deposit 21 explained above, the etching gas is supplied directly to the EA area 1c and via the LD area 1b to the boundary 1d, thereby causing the etching of much more anomalous deposit as compared with the etching in the EA area 1c.

As shown in Part (b) of FIG. 3, the anomalous deposit 21 is removed in the etching. As a result of the etching, the surface of buffer layer 3d is planarized. After growing the buffer layer 3d in the metal-organic vapor phase deposition reactor to form a semiconductor product including the anomalous deposit 21 and buffer layer 3d, the same reactor is used for the subsequent etching of the anomalous deposit 21 without taking out the semiconductor product from the reactor.

Figure 4:
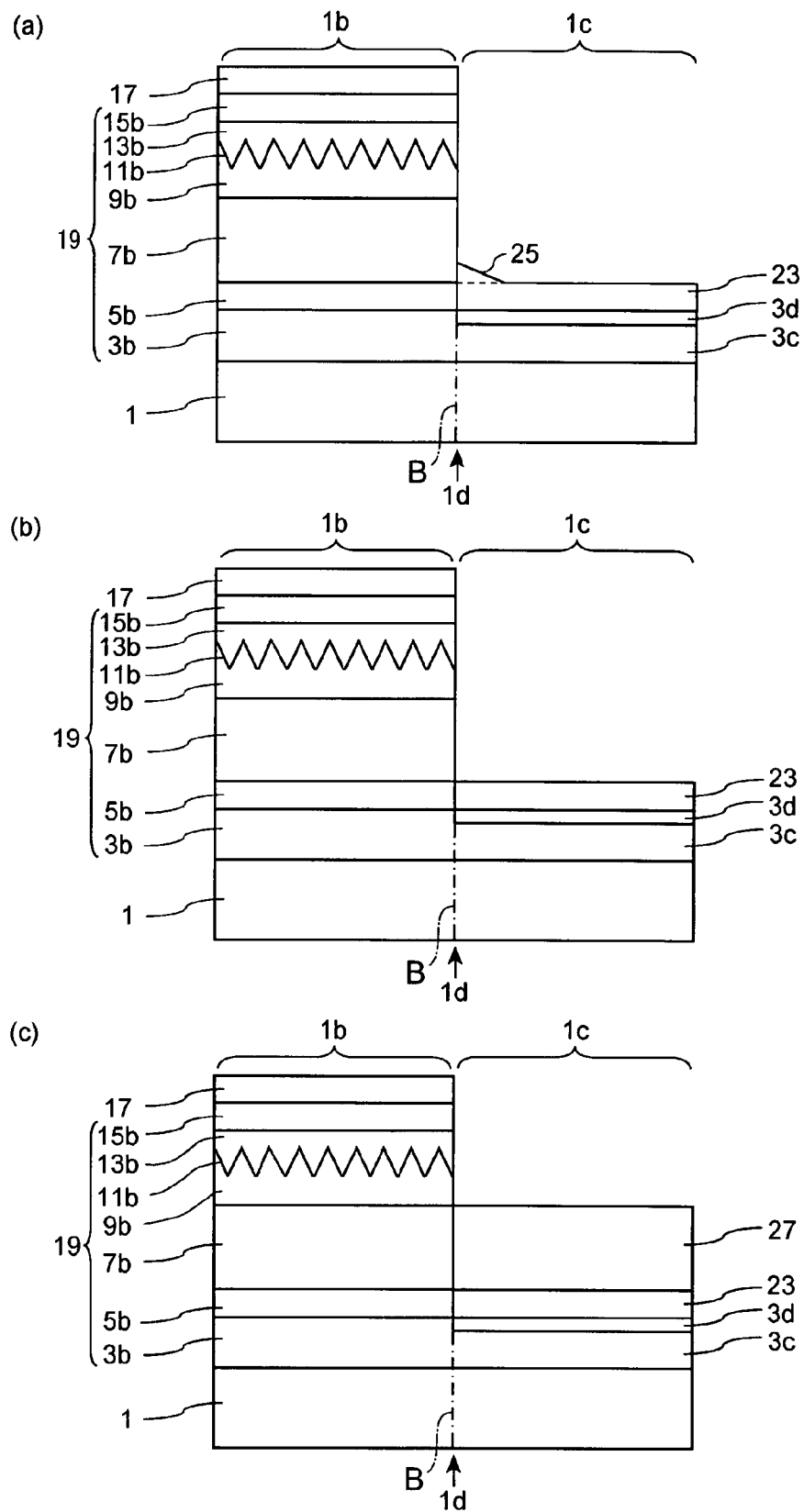

Referring to Part (a) of FIG. 4, a first optical guide layer 23 for the EA modulator is grown on the buffer layer 3d. For example, the first optical guide layer 23 is made of GaInAsP having a bandgap corresponding to the wavelength of 1150 nm, and has a thickness of 60 nm. The first optical guide layer 23 is grown using the insulating film mask 17 by metal-organic vapor phase deposition method as in the case of the formation of the buffer layer 3d. Accordingly, anomalous deposit 25 shown in Part (a) of FIG. 4 is formed on the end face 19a in the EA area 1c around the boundary 1d. The reason why the anomalous deposit 25 is formed is the same as the formation of the anomalous deposit 21.

Referring to Part (b) of FIG. 4, the anomalous deposit 25 is removed by etching. The anomalous deposit 25 can be etched as in the case of the removal of the anomalous deposit 21. After the etching, the surface of the first optical guide layer 23 is planarized.

Referring to Part (c) of FIG. 4, an active layer 27 for the EA modulator is grown on the planarized surface of the first optical guide layer 23. The active layer 27 is grown using the insulating film mask 17 by metal-organic vapor phase deposition method. The active layer 27 includes, for example, a GaInAsP layer. The active layer 27 has a quantum well structure which well layers and barrier layers are alternatively arranged, and its thickness is, for example, 105 nanometers. The active layer 27 is hardly bent because the surface of the first optical guide layer 23 is planarized and the well layers and barrier layers of the active layer 27 are thin in thickness.

Figure 5:
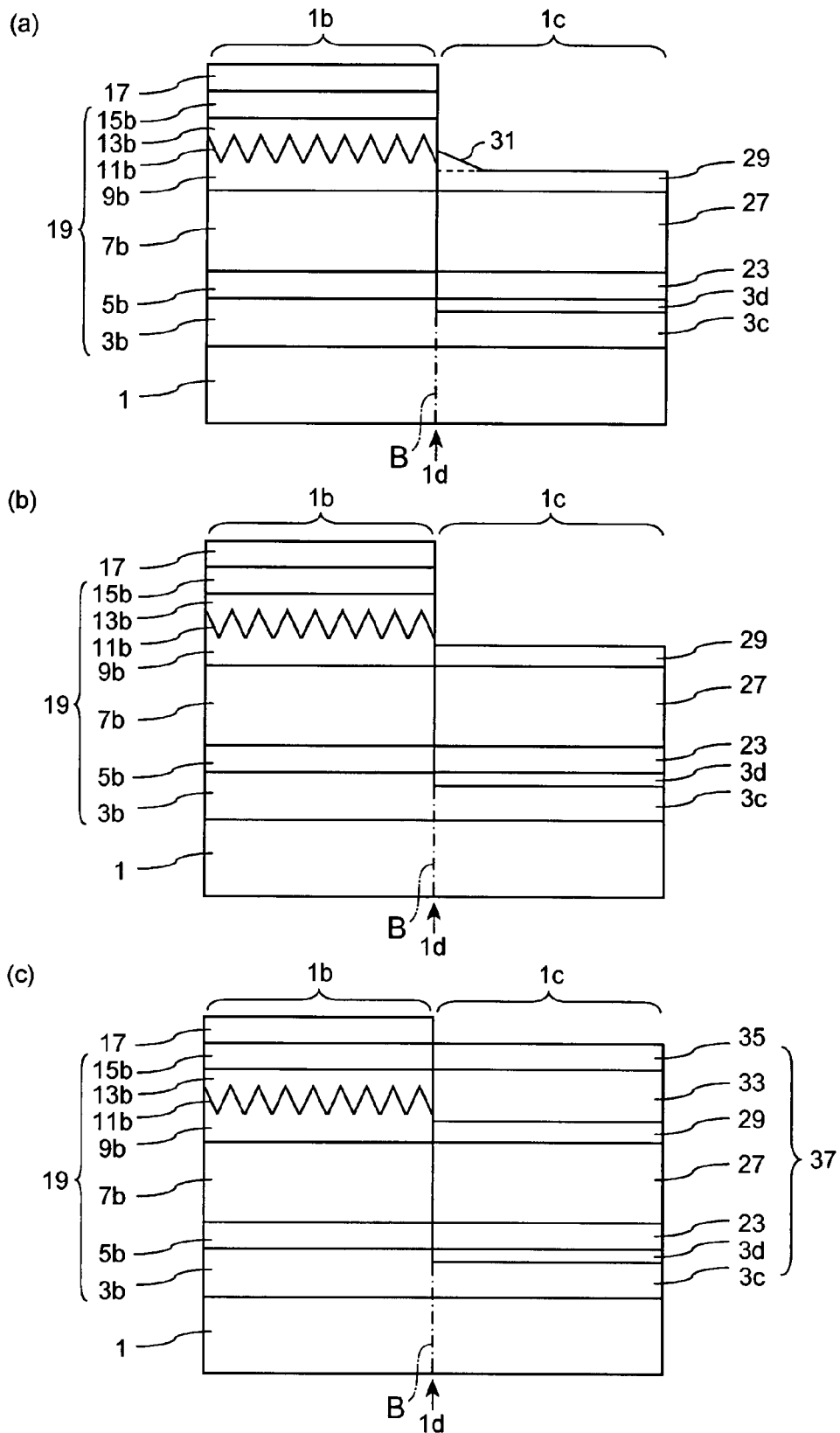

Referring to Part (a) of FIG. 5, a second optical guide layer 29 for the EA modulator is grown on the active layer 27. The second optical guide layer 29 is made of, for example, GaInAsP of the bandgap corresponding to a wavelength of 1150 nanometers, and has a thickness of, for example, 60 nanometers. The second optical guide layer 29 is grown using the insulating film mask 17 by metal-organic vapor phase deposition method. Accordingly, anomalous deposit 31 shown in Part (a) of FIG. 5 is formed on the end face 19a in the EA area 1c around the boundary 1d. The reason why the anomalous deposit 31 is formed is the same as the formation of the anomalous deposits 21 and 25. Referring to Part (b) of FIG. 5, the anomalous deposit 31 is removed by etching. The anomalous deposit 31 can be etched as in the case of the removal of the anomalous deposits 21 and 25. As a result of the etching, the surface of the first optical guide layer 29 is planarized.

Referring to Part (c) of FIG. 5, a cladding layer 33 and a cap layer 35 for the EA modulator is grown on the second optical guide layer 29. The cladding layer 33 is, for example, an InP layer doped with Zn, and its thickness is, for example, 100 nanometers. The carrier concentration of the cladding layer 33 is, for example, $6.5 \times 10^{+17}$ $cm^{-3}$. The cap layer 35 is formed on the cladding layer 33. The cap layer 35 is, for example, an InGaAs layer doped with Zn, and its thickness is, for example, 100 nanometers. The carrier concentration of the cap layer 35 is, for example, $2.0 \times 10^{+17}$ $cm^{-3}$.

The cladding layer 33 is grown using the insulating film mask 17 by metal-organic vapor phase deposition method.

Thus, anomalous deposit is formed on the end face 19a in the EA area 1c around the boundary 1d. After this formation of the cladding layer 33, this anomalous deposit is removed. Etching by use of the insulating film mask 17 can be used as in the case of the removal of the anomalous deposits 21, 25 and 31.

The cap layer 35 is grown using the insulating film mask 17 by metal-organic vapor phase deposition method. Thus, anomalous deposit is formed on the end face 19a in the EA area 1c around the boundary 1d. After growing the cap layer 35, this anomalous deposit is removed. Etching by use of the insulating film mask 17 can be used as in the case of the removal of the anomalous deposits 21, 25 and 31. As a result of the above etching, the surface of the cap layer 35 is planarized.

As explained above, in the etching step and the semiconductor growing step for the EA modulator, the semiconductor portion 37 is formed on the EA area 1c. The semiconductor portion 37 includes the buffer layer 3c, 3d, the first optical guide layer 23, the active layer 27, the second optical guide layer 29, the cladding layer 33, and the cap layer 35. The semiconductor portion 37 abuts against the first semiconductor portion 19 at the boundary 1d to form an optical coupling therebetween. The anomalous deposits that are created in growing each layer contained in the semiconductor portion 37 are removed as above by etching to make the surface of the semiconductor portion 37 planarized. Accordingly, the positional misalignment between the active layer 7b for the semiconductor layer and the active layer 27 for the EA modulator is made small.

Figure 6:
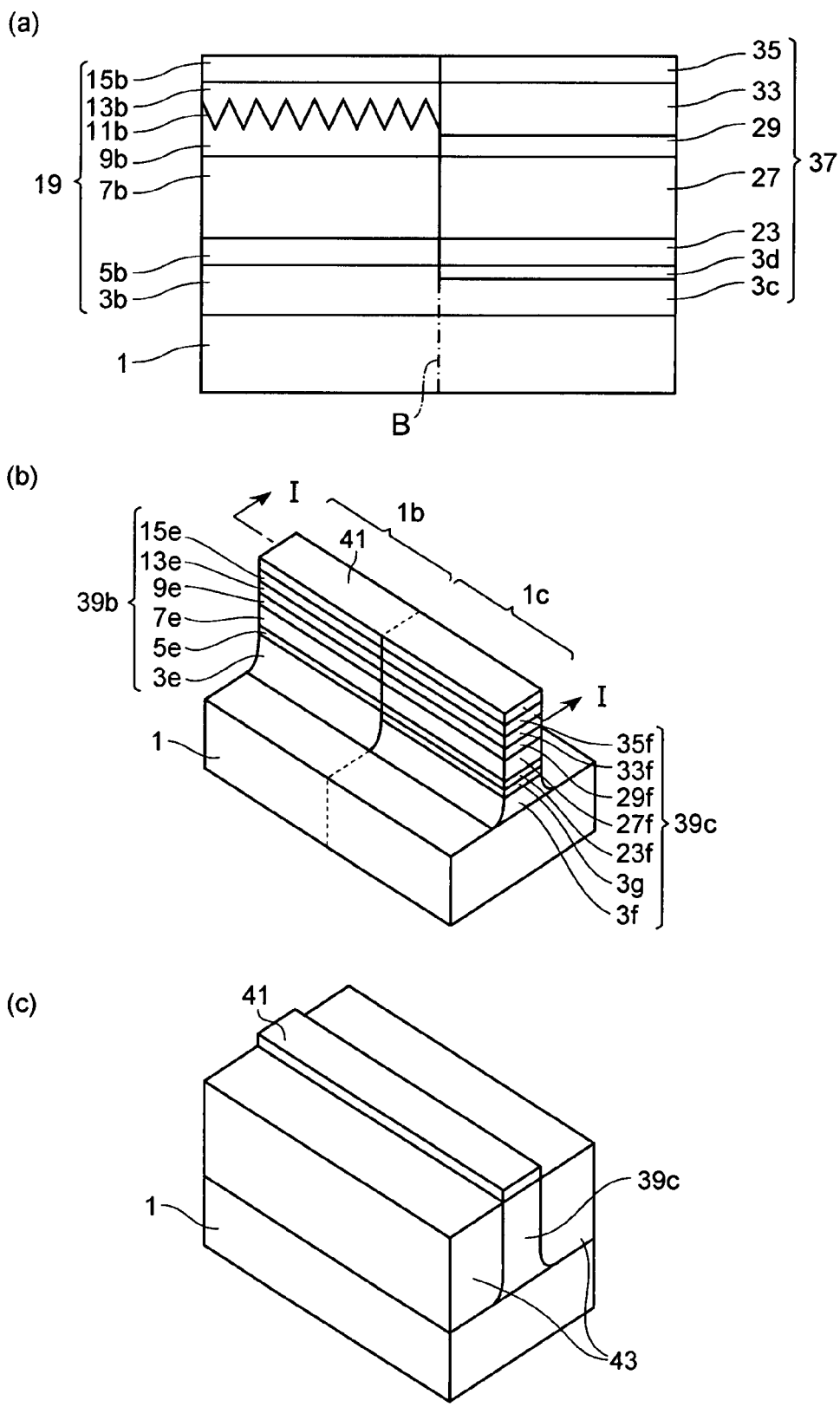
FIGS. 6 and 7 are schematic views showing the method of fabricating a semiconductor optical device according to the embodiment of the present invention.

Referring to Part (a) of FIG. 6, the insulating film mask 17 is removed. Part (b) of FIG. 6 is a perspective view showing a part of a product in the manufacturing steps of the semiconductor laser. The cross sectional views in FIG. 1 to Part (a) of FIG. 6 are taken along I-I line shown in Part (b) of FIG. 6. Referring to Part (b) of FIG. 6, optical waveguides 39b, 39c are formed and extend along the axis directed from the LD area 1b to the EA area 1c. The optical waveguide 39b is provided on the LD area 1b, and the optical waveguide 39c is provided on the EA area 1c.

As shown in Part (b) of FIG. 6, in order to form the optical waveguides 39b and 39c, a mask 41 is formed on the first and second semiconductor portions 19 and 37 and extend in a direction of the above axis. The mask 41 is made of insulator and its shape is a stripe, for example. The insulating material for the mask 41 is made of silicon oxide, such as $SiO_2$, or silicon nitride, such as SiN.

In order to form the optical waveguides 39b and 39c, the first and second semiconductor portions 19 and 37 are etched using the mask 41 to expose the primary surface 1a of the InP semiconductor substrate 1. By this etching, a stripe mesa for acting as optical waveguides is obtained. The optical waveguide 39b includes a buffer layer 3e, a first optical guide layer 5e, an active layer 7e, a second optical guide layer 9e, a cladding layer 13e and a cap layer 15e, and these layers are located on the LD area 1b. The optical waveguide 39c includes a buffer layer 3f and 3g, a first optical guide layer 23f, an active layer 27f, a second optical guide layer 29f, a cladding layer 33f and a cap layer 35f, and these layers are located on the EA area 1c.

Referring to Part (c) of FIG. 6, the mesa of the optical waveguides 39b and 39c is buried by a burying semiconductor layer 43. In order to bury the mesa of the optical waveguides 39b and 39c, the semiconductor layer 43, such as Fe-doped InP, for burying the above mesa is regrown using the mask 41 on the InP semiconductor substrate 1. After this growth, the mask 41 is removed.

Figure 7:
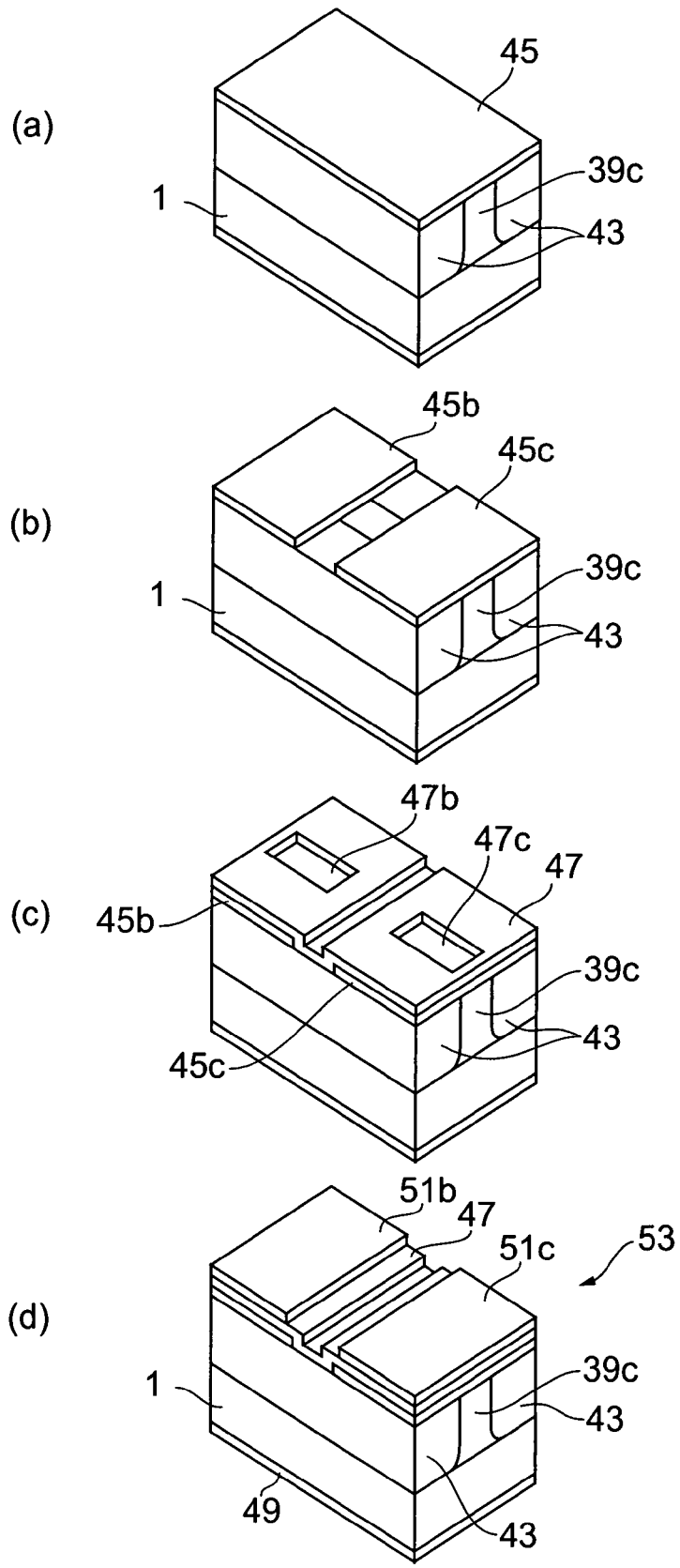

Referring to Part (a) of FIG. 7, a contact layer 45 is formed on the optical waveguides 39b and 39c and the burying semiconductor layer 43. The contact layer 45, for example Zn-doped GaInAs, is formed on the whole surface of the optical waveguides 39b and 39c and the burying semiconductor layer 43.

Referring to Part (b) of FIG. 7, a contact layer 45b for the semiconductor laser and a contact layer 45c for the EA modulator are formed. In order to form the contact layers 45b and 45c, the part of the contact layer 45 on the boundary 1d is removed to form a groove, and a part of the surface of the optical waveguides 39b and 39c is exposed at the removed portion of the contact layer 45. The groove extends in a direction perpendicular to the above axis. By this removal, the contact layers 45b and 45c is separated from each other, and this removal permits the electrical separation of one electrode for the semiconductor laser and LD and another electrode for the EA modulator from each other.

Referring to Part (c) of FIG. 7, an insulating film 47 is formed on the exposed surfaces of the optical waveguides 39b and 39c, the contact layers 45b and 45c, and the burying semiconductor layer 43. The insulating film 47 can be made of, for example, insulating silicon compound. The insulating film 47 has openings 47b and 47c to the contact layers 45b and 45c, respectively.

Referring to Part (d) of FIG. 7, a cathode electrode 49 is formed on the backside of the InP semiconductor substrate 1. An anode electrode 51b for the semiconductor laser is formed on the insulating film 47 and opening 47b, and another anode electrode 51c for the EA modulator is formed on the insulating film 47 and opening 47c. The anode electrodes 51b and 51c are connected through the openings 47b and 47c with the contact layers 45b and 45c, respectively. After the above steps, the semiconductor optical device 53 as shown in Part (d) of FIG. 7 is obtained.

As explained above, the present embodiment comprises the step of, before growing the active layer 27 for the EA modulator, removing material anomalously deposited on the end face 19a of the first semiconductor portion 19, i.e., at least a part of anomalous deposit which has been grown in forming the first optical guide layer 23. This step reduces a portion of the active layer 27 curved by the anomalous deposit. Therefore, the present method prevents the optical coupling between the active layer 7b for the semiconductor laser and the active layer 27 for the EA modulator from decreasing due to the curved portion of the active layer 27.

Since the present embodiment comprises an etching step provided just after growing each of the buffer layer 3d, the second optical guide layer 29, cladding layer 33 and the cap layer 35, the curved portions of these layers formed by anomalous deposits in their growth are also made small.

Each of the above etching steps for removing the anomalous deposit follows the corresponding growing step of the layer for the EA modulator in the same reactor. These sequences prevent the oxidization of the semiconductor surfaces caused by taking out them from the reactor, and shorten the processing time for the repetition of the growing step and etching step.

Since the surfaces of the semiconductor layers are planarized in the etching step, optical performances of the semiconductor optical device 53 according to the present embodiment cannot be deteriorated due to the bending of semiconductor layers caused by the anomalous growth.

Having described and illustrated the embodiments of the semiconductor optical amplifiers according to the invention, the application of the present invention is not limited thereto. Details of structures of these devices can be modified as necessary. We therefore claim all modifications and variations coming within the spirit and scope of the following claims.

What is claimed is:

1. A method of fabricating a semiconductor optical device, the semiconductor optical device including a first semiconductor optical element and a second optical semiconductor element, the method comprising the steps of: growing plural semiconductor layers for the first semiconductor optical element on a primary surface of a substrate in a metal-organic vapor phase deposition reactor, the primary surface of the substrate having a first area for the first semiconductor optical element and a second area for the second optical semiconductor element; forming an insulating mask on the plural semiconductor layers and the first area; etching the plural semiconductor layers by use of the insulating mask to form a semiconductor portion having an end face; after etching the plural semiconductor layers, growing a layer of a first semiconductor for the second optical element on the second area and depositing the first semiconductor on the end face by use of the insulating mask in the metal-organic vapor phase deposition reactor; after growing the layer of the first semiconductor, supplying etchant for etching the first semiconductor to remove at least a part of the deposit of the first semiconductor on the end face by use of the insulating mask; after removing at least a part of the deposit of the first semiconductor, growing a layer of a second semiconductor for the second optical element on the second area by use of the insulating mask in the metal-organic vapor phase deposition reactor; after growing the layer of the second semiconductor, growing a layer of a third semiconductor on the second area and depositing the third semiconductor on the end face by use of the insulating mask in the metal-organic vapor phase deposition reactor; and after growing the layer of the third semiconductor, supplying etchant for etching the third semiconductor to remove at least a part of the deposit of the third semiconductor by use of the insulating mask.

2. The method according to claim 1, wherein gas containing the etchant for etching the first semiconductor is supplied to the metal-organic vapor phase deposition reactor.

3. The method according to claim 2, wherein the gas containing the etchant for etching the first semiconductor includes HC1.

4. The method according to claim 3, wherein the gas containing the etchant for etching the first semiconductor further includes at least one of AsH3 and PH3.

5. The method according to claim 1, wherein the layer of the first semiconductor is formed for an optical guide layer for the second optical semiconductor element, and the layer of the second semiconductor is formed for an active layer for the second optical semiconductor element.

6. The method according to claim 5, wherein the semiconductor portion includes a semiconductor layer for an active layer of the first semiconductor optical element.

7. The method according to claim 1, wherein one of the first and second optical semiconductor elements includes a semiconductor laser and the other of the first and second optical semiconductor elements includes an electro-absorption modulator.

8. The method according to claim 1, wherein the layer of the first semiconductor is formed for an optical guide layer of the second optical element; the layer of the second semiconductor is formed for an active layer of the second optical element; and the layer of the third semiconductor is formed for another optical guide layer of the second optical element.

9. The method according to claim 1, wherein gas containing the etchant for etching the third semiconductor is supplied to the metal-organic vapor phase deposition reactor.

10. The method according to claim 9, wherein the gas containing the etchant for etching the third semiconductor includes HC1.

11. The method according to claim 1, further comprising the steps of: prior to growing the layer the first semiconductor, growing a layer of a fourth semiconductor for the second optical element on the second area and deposit of depositing the fourth semiconductor on the end face by use of the insulating mask in the metal-organic vapor phase deposition reactor; and prior to growing the layer of the first semiconductor and after growing the layer of the fourth semiconductor, supplying etchant for etching the fourth semiconductor to remove at least a part of the deposit of the fourth semiconductor by use of the insulating mask.

12. The method according to claim 11, wherein the layer of the first semiconductor is formed for an optical guide layer of the second optical element; the layer of the second semiconductor is formed for an active layer of the second optical element; the layer of the third semiconductor is formed for another optical guide layer of the second optical element; and the layer of the fourth semiconductor is formed for a buffer layer of the second optical element.

13. The method according to claim 12, wherein the gas containing the etchant for etching the fourth semiconductor includes HC1.

14. The method according to claim 11, wherein gas containing the etchant for etching the fourth semiconductor is supplied to the metal-organic vapor phase deposition reactor.

15. The method according to claim 1, wherein the end face extends along a reference plane, and the reference plane intersects with the primary surface.

16. The method according to claim 1, wherein the layer of the second semiconductor has a multiple quantum well structure for an active layer of the second optical semiconductor element.

17. The method according to claim 1, wherein the insulating mask is made of silicon oxide.

18. A method of fabricating a semiconductor optical device, the semiconductor optical device including a first semiconductor optical element and a second optical semiconductor element, the method comprising the steps of: growing plural semiconductor layers for the first semiconductor optical element on a primary surface of a substrate in a metal-organic vapor phase deposition reactor, the primary surface of the substrate having a first area for the first semiconductor optical element and a second area for the second optical semiconductor element; forming an insulating mask on the plural semiconductor layers and the first area; etching the plural semiconductor layers by use of the insulating mask to form a semiconductor portion having an end face; after etching the plural semiconductor layers, growing a layer of a first semiconductor for the second optical element on the second area and depositing the first semiconductor on the end face by use of the insulating mask in the metal-organic vapor phase deposition reactor; after growing the layer of the first semiconductor, supplying etchant for etching the first semiconductor to remove at least a part of the deposit of the first semiconductor on the end face by use of the insulating mask; and after removing at least a part of the deposit of the first semiconductor, growing a layer of a second semiconductor for the second optical element on the second area by use of the insulating mask in the metal-organic vapor phase deposition reactor; prior to growing the layer of the first semiconductor, growing a layer of a third semiconductor for the second optical element on the second area and depositing the third semiconductor on the end face by use of the insulating mask in the metal-organic vapor phase deposition reactor; and prior to growing the layer of the first semiconductor and after growing the layer of the third semiconductor, supplying etchant for etching the third semiconductor to remove at least a part of the deposit of the third semiconductor by use of the insulating mask.

19. The method according to claim 18, wherein the layer of the first semiconductor is formed for an optical guide layer of the second optical element; the layer of the second semiconductor is formed for an active layer of the second optical element; and the layer of the third semiconductor is formed for a buffer layer of the second optical element.

* * * * *